United States Patent [19]

Okazawa

[11] Patent Number: 5,316,961
[45] Date of Patent: May 31, 1994

[54] FLOATING GATE TYPE ERASABLE AND PROGRAMABLE READ ONLY MEMORY CELL, METHOD OF MAKING THE SAME, AND ELECTRICALLY ERASING AND WRITING METHOD

[75] Inventor: Takeshi Okazawa, Tokyo, Japan

[73] Assignee: NEC Corporation, Japan

[21] Appl. No.: 791,435

[22] Filed: Nov. 13, 1991

[30] Foreign Application Priority Data

Nov. 14, 1990 [JP] Japan .................................. 2-307687

[51] Int. Cl.⁵ .......................................... H01L 21/265
[52] U.S. Cl. .................................... 437/43; 437/35
[58] Field of Search ............ 437/43, 48, 52, 51, 437/35, 24

[56] References Cited

U.S. PATENT DOCUMENTS

| | | | |
|---|---|---|---|
| 4,142,926 | 3/1979 | Morgan | 437/43 |
| 4,849,369 | 7/1989 | Jeuch et al. | 437/228 |
| 4,851,361 | 7/1989 | Schumann et al. | 437/43 |
| 5,045,488 | 9/1991 | Yeh | 437/43 |
| 5,073,514 | 12/1991 | Ito et al. | 437/35 |
| 5,190,887 | 3/1993 | Tang et al. | 437/43 |

FOREIGN PATENT DOCUMENTS

| | | | |
|---|---|---|---|
| 52-102073 | 6/1982 | Japan | 437/43 |
| 59-61185 | 4/1984 | Japan | 437/35 |

Primary Examiner—George Fourson
Assistant Examiner—Richard A. Booth
Attorney, Agent, or Firm—Laff, Whitesel, Conte & Saret

[57] ABSTRACT

Disclosed is an improved floating gate type EPROM in which: the overlying P-type drain diffusion layer extends apart from the P-type channel stopper and ends at a location below somewhat inside the edge of the floating gate in the P-type semiconductor substrate; and the underlying N-type drain diffusion layer extends short of the terminal end of the overlying drain diffusion layer. This arrangement has the effect of increasing the breakdown voltage and the drain-to-semiconductor substrate diode characteristic of the device. Also, disclosed are a method of making such improved floating gate type EPROM and an electrically erasing and writing method for floating gate type EPROMS.

4 Claims, 4 Drawing Sheets

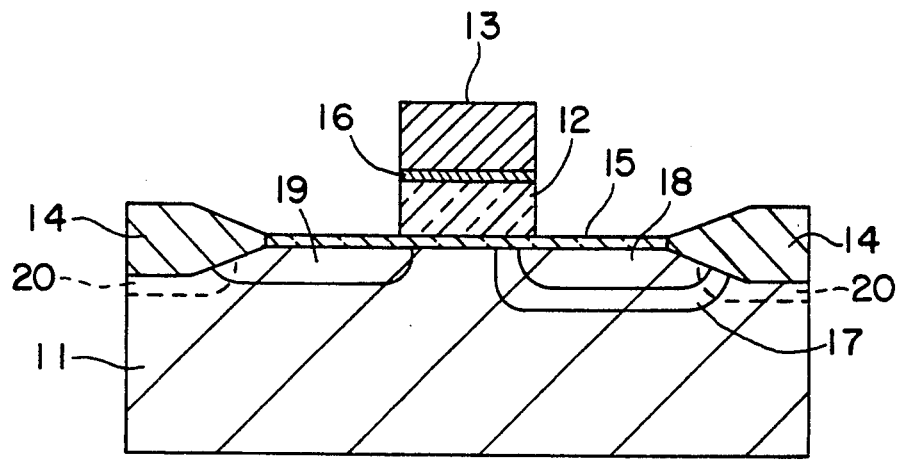
F I G. 1
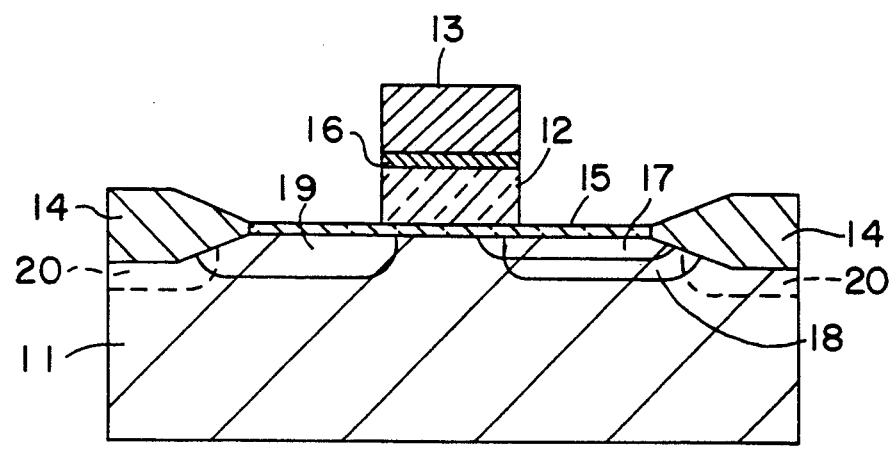
F I G. 2

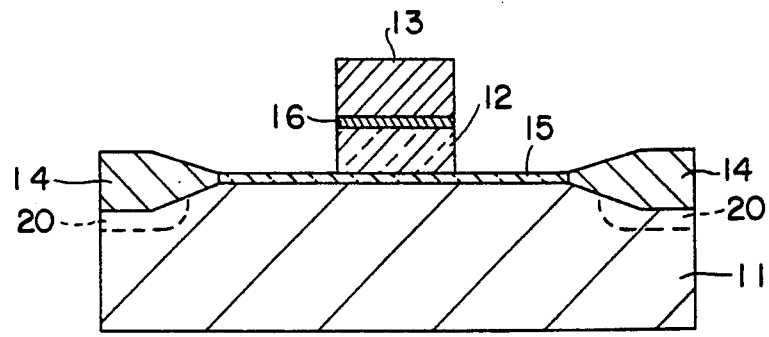
F I G. 3A
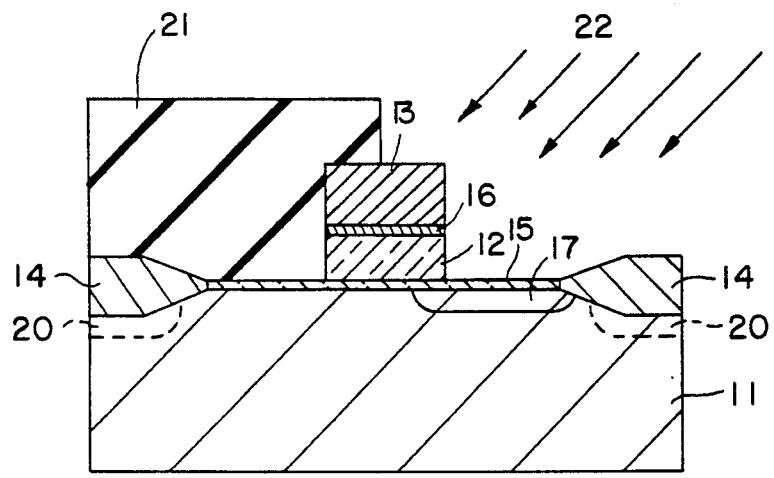
F I G. 3B
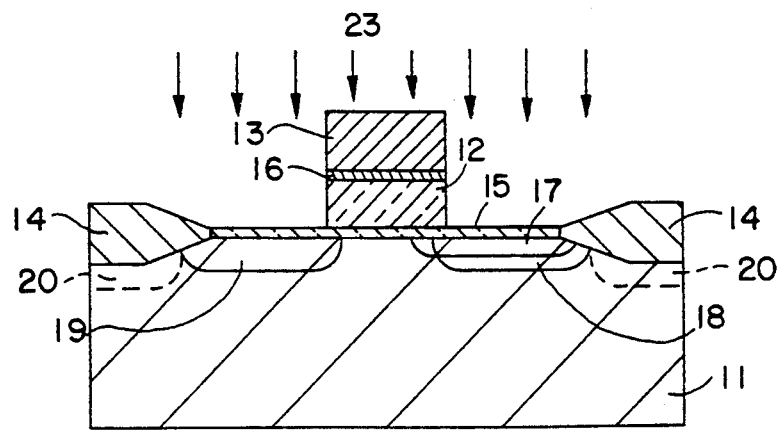
F I G. 3C

FLOATING GATE TYPE ERASABLE AND PROGRAMABLE READ ONLY MEMORY CELL, METHOD OF MAKING THE SAME, AND ELECTRICALLY ERASING AND WRITING METHOD

BACKGROUND OF THE INVENTION

1. Field of the Invention

The present invention relates to a semiconductor storage device equipped with a floating gate, particularly floating gate type erasable and programable read only memory cell (abbreviated EPROM). Particularly the present invention relates to an improved floating gate type EPROM structure, and a method of making the same. Also, the present invention relates to an electrically erasing an writing method for such floating type EPROM.

2. Description of the Prior Art

Such floating gate type EPROM is known as a memory device permitting the quick writing of data. This memory structure is discussedin the paper "A DSA-type Non-Volatile Memory Transistor with self-Aligned Gates" by M. Kikuchi et al, Proceedings of the 9th Conference on Solid-State Devices, 1977, and is disclosed and referred to as "Diffusion-Self-Alignment" (abbreviated DSA) in the paper "New Proposal for Scaling Rule; Compatibleness of Reliability with Excellent Performance" by K. Yoshikawa et al, January issueof the magazine "Nikkei Microdevice", 1990. The structure and operation of a conventional floating gate-type EPROM cell will be described below with reference to FIG. 1. As shown, it is built in a P-type semiconductor substrate 11 of silicon and is isolated by an area 14. An underlying channel stopper 20 extends on the bottom surface of the isolation area 14. A first gate insulating film 15 is applied to the top surface of the semiconductor substrate 11. A floating gate 12 is formed on the first gate insulating film 15, and a second gate insulating film 16 is applied to the top surface of the floating gate 12. A control gate 13 is formed on the second gate insulating film 16. An N-type source diffusion layer 19 extends from the isolation area 14 and ends at a location below one edge of the floating gate 12 in the semiconductor substrate 11. A second N-type drain diffusion layer 18 extends from the isolation area 14 and the channel stopper 20, and ends at a location below somewhat inside the other edge of the floating gate 12 in the semiconductor substrate 11. Finally, a first P-type drain diffusion layer 17 lies under the second N-type drain diffusion layer 18, extending from the isolation area 14 and the channel stopper 20 and ending at a location below the other edge of the floating gate 12 ahead of the terminal end of the second N-type drain diffusion layer 18 in the semiconductor substrate 11. It should be noted that the first drain diffusion layer 17 is heavily doped with a P-type impurity particularly in a concentration of 10 to 100 times higher than the semiconductor substrate 11 and that the so heavily doped first drain diffusion layer 17 completely encircles the second N-type drain diffusion layer 18. This will be again referred to later in describing the central feature of the present invention. Thanks to the extension of the first P-type drain diffusion layer 17 ahead of the second N-type drain diffusion layer 18, there exist an abundant of holes at a location below the edge of the floating gate 12 with the result that an electric field of increased strength appears just below the floating gate 12, thereby enhancing creation of hot electrons and accordingly increasing the writing speed.

The complete enclosure of the second N-type drain diffusion layer 18 by the first P-type drain diffusion layer 17, however, increases the electrostatic junction capacitance of these diffusion layers. Thus, an array of such memory cells will have a large total capacitance to cause an adverse effect on the operation of the memory array, that is, the increasing of the access and writing time. Also, it should be noted that the first P-type drain diffusion layer 17 is heavily doped with a P-type impurity, extending from the channel stopper 20, and that the channel stopper 20 is heavily doped with a P-type impurity in a concentration several orders of magnitude thicker than the P-type semiconductor substrate 11 With this arrangement the overlapping area of these heavily doped layers 17 and 20 will be still increasingly abundant in holes, and this hole-abundant region will be the cause for substantially lowering the breakdown voltage of the drain diffusion layer, and substantially deteriorating the diode characteristic of the drain diffusion layer with respect to the semiconductor substrate 11. In the end disadvantageously the writing speed will be lowered.

In the writing-in operation electrons will be injected into the floating gate of the memory device. The charging of the floating gate with electrons, however, will be adversely affected by surrounding parasitic positive ions. Specifically, the information retaining capability of the memory device will be appreciably lowered in a relatively short time by partial cancellation of electrons with surrounding parasitic positive ions.

SUMMARY OF THE INVENTION

One object of the present invention is to provide an improved floating gate type EPROM which permits the writing at an increased speed.

Another object of the present invention is to provide a method making such an improved floating gate type EPROM.

Still another object of the present invention is to provide a new method of electrically erasing and writing data in a floating gate type EPROM, guaranteed free of the adverse effect on its information retaining capability caused by surrounding parasitic positive ions, and still increasing the writing speed.

According to the present invention a floating gate type electrically erasable and programable read only memory cell built in a semiconductor substrate of one conductivity type and isolated by an isolation area with an underlying channel stopper extending on the bottom surface of said isolation area comprises; a first gate insulating film on the top surface of the semiconductor substrate; a floating gate on the first gate insulating film with a second gate insulating film applied to the top surface of said floating gate; a control gate on the second gate insulating film; a source diffusion layer of the other conductivity type extending from said isolation area and ending at a location below one edge of the floating gate in the semiconductor substrate; a first drain diffusion layer of the one conductivity type extending from the isolation area but apart from the channel stopper and ending at a location below somewhat inside the other edge of said floating gate in said semiconductor substrate; and a second drain diffusion layer of said the other conductivity type lying under said first drain diffusion layer, extending from the isolation area and ending at a location below the other edge of the floating gate in the semiconductor substrate, but reaching short of the terminal end of the first drain diffusion layer in said semiconductor substrate.

The central features of a floating type EPROM cell according to the present invention reside in that the first drain diffusion layer of one conductivity type extends from the isolation area but apart from the channel stopper, and ends at a location below somewhat inside the edge of the floating gate in the semiconductor substrate; and that the second drain diffusion layer of the other conductivity type lies under the first drain diffusion layer, extending from the isolation area and ending at a location below the edge of the floating gate, but reaching short of the terminal end of the first drain diffusion layer in the semiconductor substrate. Extension of the first P-type drain diffusion layer apart from the P-type channel stopper has the effect of eliminating of appearance of the overlapping hole-abundant region as described earlier. Absence of such hole-abundant area will permit the increasing of the breakdown voltage of the drain diffusion layer, and at the same time, will improve the diode characteristic of the drain diffusion layer with respect to the semiconductor substrate so that the writing speed may be substantially raised.

A method of making an improved floating gate type electrically erasable and programable read only memory cell according to the present invention comprises the steps of: preparing according to a conventional method a semi-finished product built in a semiconductor substrate of one conductivity type and isolated by an isolation area with an underlying channel stopper extending on the bottom surface of the isolation area, the semi-finished product comprising a first gate insulating film on the top surface of the semiconductor substrate, a floating gate on the first gate insulating film with a second gate insulating film applied to the top surface of said floating gate, and a control gate on the second gate insulating film; covering the top surface of the semiconductor substrate except for a selected area under which a composite drain diffusion layer is to be formed; injecting ions of an impurity of one conductivity type at a given acute angle with respect to the normal line which is perpendicular to the major surface of said semiconductor substrate to form a first impurity-diffusion region of one conductivity type in the semiconductor substrate; removing the covering material to expose the whole area of the top surface of the semiconductor substrate; injecting ions of an impurity of the other conductivity type perpendicular to the major surface of the semiconductor substrate to form a source diffusion layer and at the same time, a second impurity-diffusion region in said semiconductor substrate, said ions of an impurity of the other conductivity type having increased acceleration energy and density compared with said ions of an impurity of one conductivity type.

An electrically erasing and writing method for a floating gate type electrically erasable and programable read only memory cell according to the present invention comprises the steps of: allowing said memory cell to remain at its thermal equilibrium in which no electrons are stored in the floating gate of said memory cell to assume this thermal equilibrium condition to be a writing condition; extructing electrons in the form of Fowler-Noldheim tunneling current from the floating gate electrode of said memory cell to put the same at a potential which is positive with respect to the semiconductor substrate of said memory cell, assuming this to be an erasing condition; and applying to the control electrode of said memory cell a positive potential which is high enough to put said memory cell in its thermal equilibrium, the threshold voltage of said memory cell at its thermal equilibrium being higher in positive direction than the threshold voltage of said memory cell in said erasing condition.

The selection of thermal equilibrium as writing condition will guarantee the memory cell free of adverse effect which otherwise, would be caused by surrounding parasitic positive ions as described earlier.

Other objects and advantages of the present invention will be understood from the following description of preferred embodiments of the present invention.

BRIEF DESCRIPTION OF THE DRAWINGS

FIG. 1 shows schematically, in section, a conventional floating gate type EPROM cell;

FIG. 2 shows schematically, in section, a floating gate type EPROM cell according to the present invention;

FIGS. 3A to 3C show how a floating gate type EPROM cell of FIG. 2 can be made according to the present invention;

DETAILED DESCRIPTION OF PREFERRED EMBODIMENTS

Figure 4A:
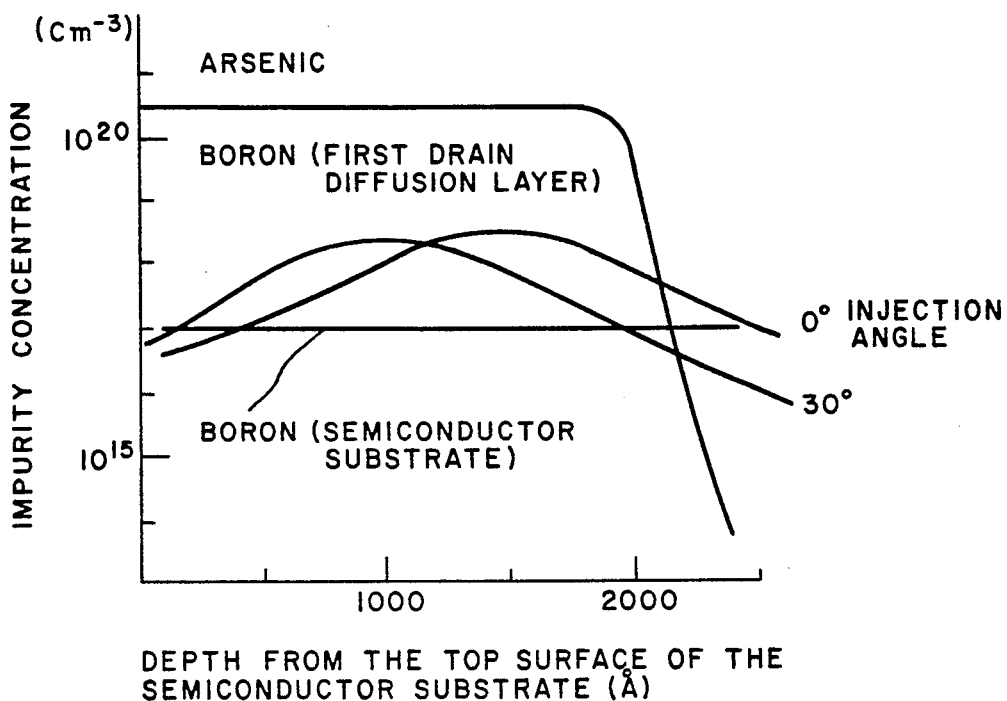
FIG. 4A is a graphic representation showing how the concentration of impurities varies with the depth from the top surface of the semiconductor substrate.

FIG. 2 shows schematically, in section, a floating gate type EPROM cell according to one embodiment of the present invention.

As seen from the drawing, the floating gate type EPROM cell is built in a P-type semiconductor substrate 11 of silicon, the impurity concentration of which ranges from $10^{16}$ to $10^{17}$ cm$^{-3}$. An isolation area 14 is formed on the semiconductor substrate 11 by oxidizing selected areas in the top surface of the semiconductor substrate 11 according to the "LOCOS" method to form silicon oxide, thus isolating EPROM cells from each other. A first gate insulating film 15 of silicon oxide is formed in the domain of the top surface of the semiconductor substrate 11 surrounded by the isolation area 14, and the silicon oxide film 15 is about 100 angstroms thick. A floating gate 12 of polycrystalline silicon is formed on the first gate insulating film 15, and a second gate insulating film 16 of silicon oxide is formed on the floating gate 12. The silicon oxide film 16 is about 200 angstroms thick. Finally a control gate 13 of polycrystalline silicon is formed on the silicon oxide film 16. A source diffusion layer 19 is formed in the obstacle-free area of the semiconductor substrate 11 which area is not occupied by the laminated gate structure and the isolation area 14, and a composition drain diffusion layer is formed in the obstacle-free area on the side which is opposite to the source diffusion layer 19 with respect to the laminated gate structure. The composite drain diffusion layer consists of a first P-type drain diffusion layer 17 such as boron diffusion layer, and a second N-type drain diffusion layer 18 such as arsenic diffusion layer. It should be noted that the first P-type drain diffusion layer 17 extends apart from the channel stopper 20 to end at a location below somewhat inside the edge of the floating gate 12 in the semiconductor substrate 11, and that the second N-type drain diffusion layer 18 lies under the first drain diffusion layer 17, extending short of the terminal position of the overlying first P-type drain diffusion layer 17. The first drain diffusion layer 17 is of increased concentration of positive holes. Likewise, the channel stopper 20 is of increased concentration of positive holes. The separation of these hole-abundant layers permits the increasing of breakdown voltage, compared with that which would be permitted in case of the overlapping of these hole-abundant layers (See FIG. 1). Also, the second N-type drain diffusion layer 18 is contiguous to the hole-lean substrate 11, and this arrangement has the advantageous effect of reducing the electrostatic capacitance of the composite drain diffusion, contrary to the case where the second N-type drain diffusion layer 18 is contiguous to the hole-abundant layer (See FIG. 1).

Now, the method of making floating gate type EPROM cells is described below with reference to FIGS. 3A to 3C.

First, a P-type semiconductor substrate 11 of (100) silicon whose impurity concentration ranges from $10^{16}$ to $10^{17}$ cm$^{-3}$ is prepared. An 8,000 angstrom thick silicon oxide isolation area 14 is formed on the semiconductor substrate 11 according to the LOCOS method. Next, a 100 angstrom thick silicon oxide film 15 is formed in the domain encircled by the isolation area 14 on the top surface of the semiconductor substrate 11 by putting the semiconductor substrate 11 in the oxidizing atmosphere at the temperature of about 900 degrees C. Thus, a first gate insulating film 15 results. A 2,000 angstrom thick polycrystalline silicon film 12 is formed on the first gate insulating film 15, and a 200 angstrom silicon oxide film 16 is formed on the polycrystalline silicon film 12. Finally, a 2000 angstrom thick polycrystalline silicon 13 is formed on the silicon oxide film 16. These laminated films are subjected to photoetching, starting from the uppermost and ending at the lowermost lamination to leave a laminated gate electrode, which is composed of a floating gate 12, a second gate insulating film 16 and a control gate 13, As seen from FIG. 3B, a predetermined part of the obstacle-free area of the top surface of the semiconductor substrate 11 which area is not occupied by the gate electrode and the isolation area 14, is covered by photoresist material 21. Then, ions of P-type impurity such as boron of an acceleration energy of 30 keV are injected into the semiconductor substrate 11 at an angle of about 30 degrees with respect to the normal line which is perpendicular to the major surface of the semiconductor substrate 11 to form a first impurity-diffusion layer 17 in the semiconductor substrate 11. The dose is about $5 \times 10^{13}$ cm$^{-2}$.

Next, the photoresist covering 21 is removed, and ions of N-type impurity such as arsenic of an acceleration energy of 70 keV are injected perpendicular to the semiconductor substrate 11 to form a second impurity-diffusion layer 18 and a source diffusion layer 19 in the semiconductor substrate 11, as shown in FIG. 3C. The dose is about $5 \times 10^{15}$ cm$^{-2}$.

Figure 4B:
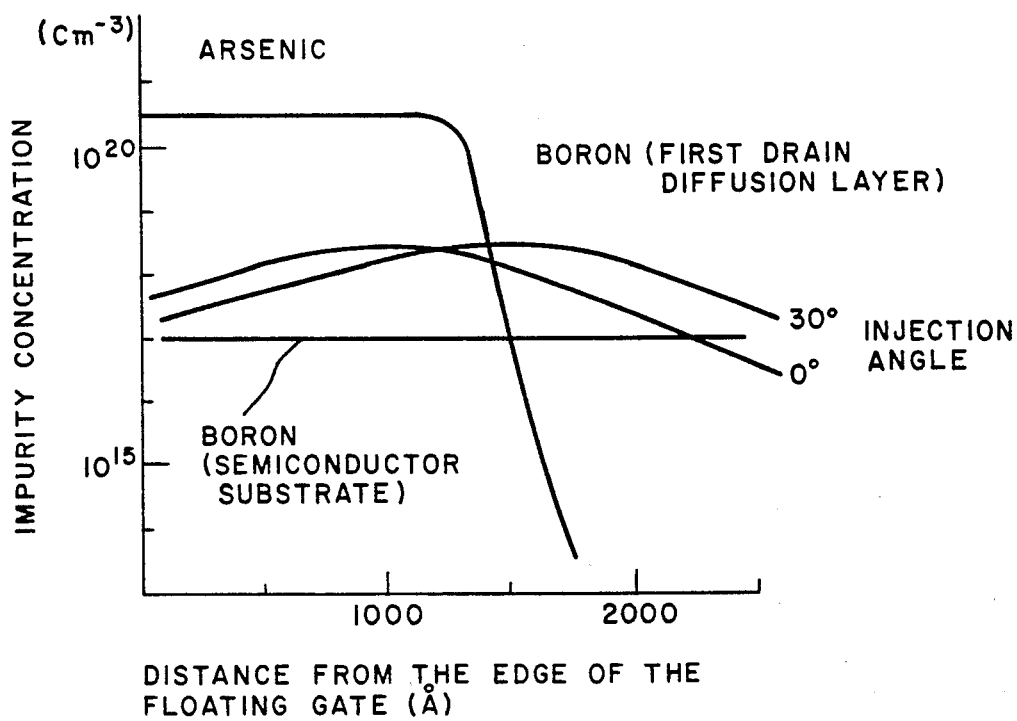
FIG. 4B is a graphic representation showing how the concentration of impurities varies with the inward distance from the edge of the floating gate.

As described above, the first drain diffusion layer 17 is formed by injecting boron ions of an acceleration energy of 30 keV into the semiconductor substrate 11 at an injection angle of about 30 degrees, and then the peak of impurity concentration appears at the depth of about 1000 angstroms measured from the top surface of the semiconductor, as seen from FIG. 4A. The boron diffusion layer 17 is contained in the overwhelming N-type or arsenic diffusion layer 18. As for the impurity concentration profile as viewed in a horizontal direction parallel to the top surface of the semiconductor substrate, the peak of boron concentration appears at the distance of about 1600 angstroms measured from the edge of the floating gate 12, and the boron diffusion 17 extends far from the arsenic diffusion 18 under the floating gate 12, as seen from FIG. 4B. Thus, the second drain diffusion layer 18 ends at a location below the edge of the floating gate 12 in the semiconductor substrate 11, reaching short of the terminal end of the first drain diffusion layer 17, and on the opposite side the first drain diffusion layer 17 is separated from the channel stopper 20.

Figure 5:
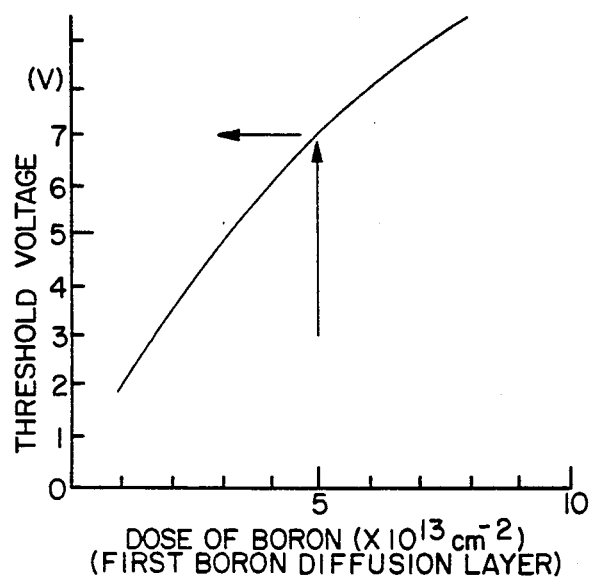
FIG. 5 is a graphic representation showing how the threshold voltage of a floating gate type EPROM varies with the dose of boron to be injected into the semiconductor substrate in forming the first drain diffusion layer.
Figure 6A:
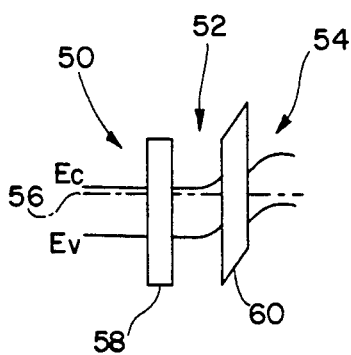
FIG. 6 shows energy bands to describe different modes of a floating gate type EPROM cell when operated according to an electrically erasing and writing method according to the present invention.
Figure 6B:
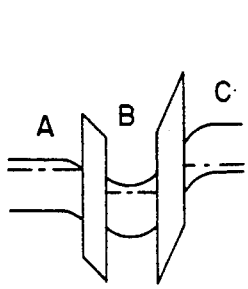

Referring to FIG. 5, the threshold voltage of the floating gate type EPROM cell at its thermal equilibrium is about 7.0 volts for the boron dose of $5 \times 10^{13}$ cm$^{-2}$, and this threshold voltage is almost equal to the voltage at which the writing is effected in an ordinary EPROM. In the writing and erasing method according to the present invention the memory cell is allowed to remain at its thermal equilibrium in which no electrons are stored in the floating gate of the memory cell, assuming this thermal equilibrium condition to be a writing condition (See FIG. 6A). Electrons are withdrawn in the form of Fowler-Noldheim tunneling current from the floating gate electrode of the memory cell to put the floating gate at a potential which is positive with respect to the semiconductor substrate, assuming this to be an erasing condition (See FIG. 6B). The threshold voltage of the memory cell at its thermal equilibrium is about 7 volts whereas the threshold voltage of the memory cell in the erasing condition is about 2 volts. Thus, a decision as to in which position the memory cell is put, writing position or erasing position, can be easily made by applying to the control gate a potential intermediate between these threshold voltage, say 5 volts to determine whether a drain current flows in the memory cell. No drain current will flow out from the drain electrode of the device when it is in writing position whereas a drain current will flow when the device is in erasing position.

Figure 6C:
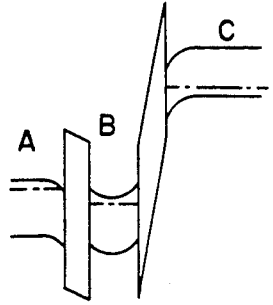

In driving the memory cell from the erasing to writing condition a positive potential (say 12 volts) is applied to the control electrode of the memory cell so that this potential (12 volts) plus the potential difference between the threshold voltages in the writing and erasing conditions (7−2=5) may be applied to the first gate insulation coating 15 (See FIG. 6C). This total voltage (17 volts) is about 1.5 times higher than that which would be applied to a floating gate type EPROM if its thermal equilibrium condition is assumed to be an erasing condition, as is the case with a conventional writing and erasing method. Accordingly the writing speed will be increased.

What is claimed is:

1. A method of making a floating gate type electrically erasable and programable read only memory cell comprising the steps of:
   preparing a semi-finished product built in a semiconductor substrate of one conductivity type and isolated by an isolation area with an underlying channel stopper extending on the bottom surface of said isolation area, said semi-finished product comprising a first gate insulating film on the top surface of said semiconductor substrate, a floating gate on said first gate insulating film with a second gate insulating film applied to the top surface of said floating gate, and a control gate on said second gate insulating film;
   covering the top surface of said semiconductor substrate except for a selected area under which a composite drain diffusion layer is to be formed;
   injecting ions of an impurity of said one conductivity type at a given acute angle with respect to the normal line which is perpendicular to the major surface of said semiconductor substrate to form a first impurity-diffusion region of said one conductivity type in said semiconductor substrate;
   removing the covering material to expose the whole area of the top surface of said semiconductor substrate;
   injecting ions of an impurity of the other conductivity type perpendicular to the major surface of said semiconductor substrate to form a source diffusion layer and at the same time, a drain region in said semiconductor substrate, said ions of an impurity of the other conductivity type having increased acceleration energy and density compared with said ions of an impurity of said one conductivity type.

2. A method of making a floating gate type electrically erasable and programmable read only memory cell according to claim 1 wherein boron ions of an acceleration energy ranging from 40 to 60 keV are injected into a P-type semiconductor substrate at an angle of about 30 degrees with respect to the normal line which is perpendicular to the major surface of said semiconductor substrate to form said first impurity-diffusion region in said semiconductor substrate; and arsenic ions of an acceleration energy of 70 keV are injected perpendicular to the major surface of said semiconductor substrate to form said second impurity-diffusion region in said semiconductor substrate.

3. A method of producing a semiconductor memory device comprising the steps of:
   forming a gate structure on a part of a surface area of a semiconductor substrate of one conductivity type in an order such that said gate structure is composed of a first gate insulating film formed on said part of said surface area, a floating gate formed on said first gate insulating film, a second gate insulating film formed on said floating gate, and a control gate formed on said second gate insulating film, said surface area of said semiconductor substrate being defined by a field insulating layer selectively formed in said semiconductor substrate;
   implanting first impurity-ions representative of said one conductivity type into said semiconductor substrate from a direction which is oblique to said surface area by using said gate structure and said field insulating layer as a mask to form an impurity region of said one conductivity type extending under said gate structure; and
   implanting second impurity-ions representative of an opposite conductivity type into said semiconductor substrate from a direction which is perpendicular to said surface area by using said gate structure and said field insulating layer to form a source region and a drain region of said opposite conductivity type with a depth which is greater than said impurity region, said drain region overlapping with a part of said impurity region and having an impurity concentration that converts said part of said impurity region into said opposite conductivity type, a remaining part of said impurity region lying under said gate structure without being converted into said opposite conductivity type.

4. The method as claimed in claim 3, wherein said semiconductor substrate has a channel stopper region of said one conductivity type under said field insulating layer and said impurity region is formed without being in contact with said channel stopper region.

* * * * *